(12) United States Patent
Nakagaki et al.

(10) Patent No.: US 7,834,317 B2
(45) Date of Patent: Nov. 16, 2010

(54) SCANNING ELECTRON MICROSCOPE AND SYSTEM FOR INSPECTING SEMICONDUCTOR DEVICE

(75) Inventors: Ryo Nakagaki, Kawasaki (JP); Toshifumi Honda, Yokohama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 523 days.

(21) Appl. No.: 11/268,568

(22) Filed: Nov. 8, 2005

(65) Prior Publication Data

US 2006/0108525 A1    May 25, 2006

(30) Foreign Application Priority Data

Nov. 10, 2004  (JP)  .............................. 2004-326924

(51) Int. Cl.
  *G01N 23/00*  (2006.01)
  *G21K 7/00*  (2006.01)
(52) U.S. Cl. ........................ 250/310; 250/306; 250/307; 250/311
(58) Field of Classification Search .................. 250/310
  See application file for complete search history.

(56) References Cited

U.S. PATENT DOCUMENTS 6,107,637 A * 8/2000 Watanabe et al. ........ 250/559.3

FOREIGN PATENT DOCUMENTS

| JP | 09-304023 | 11/1997 |
|----|-----------|---------|
| JP | 2000-123771 | 4/2000 |
| JP | 2002-281514 | 9/2002 |
| JP | 2003-324693 | 11/2003 |
| JP | 2003-331769 | 11/2003 |

* cited by examiner

*Primary Examiner*—David A Vanore
(74) *Attorney, Agent, or Firm*—Antonelli, Terry, Stout & Kraus, LLP.

(57) ABSTRACT

A scanning electron microscope has an electron source for illuminating a primary electron beam on a specimen wafer, an accelerating electrode, a condenser lens, a deflector, an objective lens, a detector for acquiring a digital image by sampling a signal of emissive electrons generated from the specimen wafer, a digitizing means, an image memory for storing, displaying or processing the acquired digital image, an input/output unit, an image creation unit and an image processor. The scanning electron microscope is provided with a sampling unit for sampling the emissive electron signal at intervals each smaller than the pixel size of the digital image to be stored, displayed or processed and an image creation process means for enlarging the pixel size on the basis of the sampled emissive electron signal to create a digital image.

15 Claims, 11 Drawing Sheets

FIG.8
(a) NORMAL
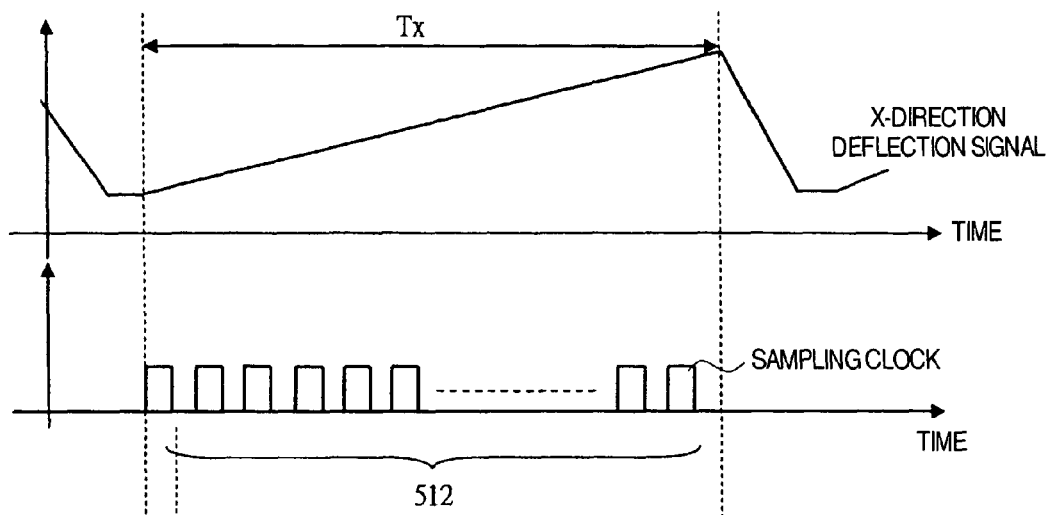
(b) DIAGONAL MODE
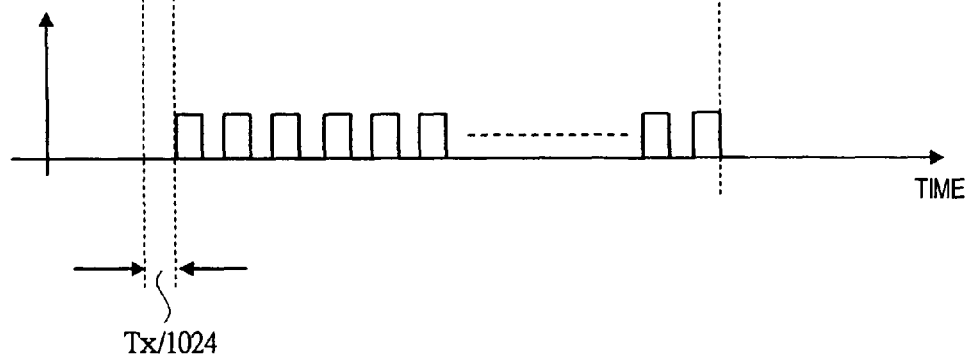

FIG.11

| | IMAGE ACQUISITION CONDITION | | | | SAMPLING CONDITION | |
|---|---|---|---|---|---|---|
| | ACCELER-ATING VOLTAGE | PROBE CURRENT | MAGNIFI-CATION | NUMBER OF FRAMES | NUMBER OF PIXELS | SAMPLING MODE |
| 1 | 800 [v] | 20 [pA] | ×50,000 | 8 | 256×256 | NORMAL |
| 2 | 800 [v] | 8 [pA] | ×80,000 | 16 | 512×512 | DOUBLE DENSITY DIAGONAL MODE |
| 3 | 500 [v] | 20 [pA] | ×30,000 | 8 | 256×256 | DOUBLE DENSITY XY DIAGONAL MODE |
| 4 | 500 [v] | 8 [pA] | ×100,000 | 16 | 512×512 | DOUBLE DENSITY XY DIAGONAL MODE |
| | | | | | | |

FIG.12

LOW MAGNIFICATION IMAGE ACQUISITION CONDITION

PROBE CURRENT　　ACCELERATING VOLTAGE　　NUMBER OF FRAMES

| MAGNIFICATION | NUMBER OF PIXELS | SAMPLING MODE |
|---|---|---|
| ×10,000 | 512x512 | NORMAL |
| ×20,000 | 1024x1024 | DOUBLE DENSITY (X) |
| ×40,000 | | DOUBLE DENSITY (Y) |
| ×50,000 | | DOUBLE DENSITY (DIAGONAL) |
| ×70,000 | | DOUBLE DENSITY (X,Y DIAGONAL) |

HIGH MAGNIFICATION IMAGE ACQUISITION CONDITION

PROBE CURRENT　　ACCELERATING VOLTAGE　　NUMBER OF FRAMES

| MAGNIFICATION | NUMBER OF PIXELS | SAMPLING MODE |
|---|---|---|
| ×50,000 | 512x512 | NORMAL |
| ×70,000 | 1024x1024 | DOUBLE DENSITY (X) |
| ×100,000 | | DOUBLE DENSITY (Y) |
| ×150,000 | | DOUBLE DENSITY (DIAGONAL) |
| ×200,000 | | DOUBLE DENSITY (X,Y DIAGONAL) |

SCANNING ELECTRON MICROSCOPE AND SYSTEM FOR INSPECTING SEMICONDUCTOR DEVICE

INCORPORATION BY REFERENCE

The present application claims priority from Japanese application JP-2004-326924 filed on Nov. 10, 2004, the content of which is hereby incorporated by reference into this application.

BACKGROUND OF THE INVENTION

The present invention relates to a scanning electron microscope for observing a structure and the like of a specimen to be observed by irradiating an electron beam on the object to be observed and detecting secondary charged particles generated therefrom, such as secondary electrons and reflected electrons, and a system for inspecting semiconductor devices and more particularly, to a technology effectively applicable to an inspection technique for observing minute circuit patterns formed on a semiconductor wafer and the like and defects and the like generated in the circuit patterns.

In order to fabricate semiconductor products such as microprocessors and memories at a high yield, it is important to monitor fabrication status in steps of semiconductor fabrication by monitoring whether a circuit pattern to be formed on a semiconductor wafer is produced with predetermined shape and size and observing whether a defect (such as deposition of foreign matters or pattern thinning) is generated on the pattern and to study causes to thereby take countermeasures in the presence of problems.

For the sake of the process monitoring, pattern observation based on an optical microscope has hitherto been practiced but presently, the width of pattern wiring formed on a semi-conductor wafer is of an order of hundred nanometers or less and recently, a scanning electron microscope capable of observing a fine structure of the nanometer order has been used for the purpose of inspecting circuit patterns.

A digital image acquisition process in the scanning electron microscope as above includes a step of irradiating a focused primary electron beam on a specimen while scanning the beam two-dimensionally, a step of detecting secondary charged particles such as secondary electrons and reflected electrons generated from an irradiated site and a step of sampling a detected signal to convert it into digital values. By arranging digital signals obtained through these steps on a two-dimensional arrangement such that these digital signals are arranged at the same positions as those scanned with the primary electron beam on the specimen, a two-dimensional digital image can be prepared.

The image quality of the digital image obtained with the scanning electron microscope has the influence upon the visibility when the image is displayed and upon the performance of an inspection process conducted using the image and therefore, digital image processing for improving the image quality is usually applied to the acquired image in advance of display and process.

For example, in order to improve the quality of low S/N and low contrast picture, procedure is taken including a process for improving the S/N and contrast by means of a smoothing filter and a frame addition process in which digital images are acquired at the same site of a specimen and average values of individual plural pixels are used as pixel values of an ultimate output image.

As another method, JP-A-2003-331769, for example, discloses a technique according to which an acquired scanning electron microscope image is subjected to a de-convolution process so as to remove a blur component of the image caused by the fact that an incident electron beam has a finite beam diameter, that is, the incident beam has energy distribution of a certain width.

Incidentally, inventors of the present invention have studied technologies of scanning electron microscope as above to clarify the following.

For example, in the image processing method concerning the background of the invention, digital images of the predetermined number of pixels are acquired and thereafter various procedures for improving the image quality are executed. Here, by taking acquisition of a one-dimensional signal generated from a specimen, for instance, the relation between the background art and the frequency information the acquired digital data has will be described.

FIG. 14A depicts the behavior of sampling an electron beam signal 201 generated from a specimen at constant sampling intervals 206, that is, at sampling timing positions 202. One of the sampling intervals 206 signifies the size of one pixel in a digital image. In the scanning electron microscope, the one interval is definitely determined from the number of pixels and the magnification of the digital image to be acquired.

FIG. 14B diagrammatically expresses the electron beam signal 201 generated from the specimen and its frequency in frequency space. In FIG. 14B, the sampling frequency or rate in FIG. 14A is expressed by an aliasing frequency 204 and an aliasing signal 205 due to the aliasing takes place in a signal component 203 in frequency space of the obtained electron beam signal 201 generated from the specimen. In typical case, this corresponds to the fact that the electron beam signal 201 generated from the specimen has a sophisticated structure and contains a frequency component higher than the sampling intervals 206. In the image quality improvement process concerned with the background art, the smoothing filtering and other image quality improving processes are applied to the image acquired at the sampling intervals 206 and this signifies that signal processing is conducted within the range of a frequency region 207 in FIG. 14B. It is therefore meant by the image restoring process according to the background art that the signal processing is conducted by noticing only the frequency region 207 without considering a region 208 and as a result, the sufficient image quality improving effect cannot sometimes be expected.

SUMMARY OF THE INVENTION

The present invention aims at improving the quality of images taken with a scanning electron microscope.

Novel features of this invention will become apparent from a description in the present specification and the accompanying drawings.

Of inventions disclosed in the present application, typical ones will be outlined in brief as follows.

More particularly, a scanning electron microscope according to the invention has sampling means for sampling secondary charged particles at intervals each narrower than the size of pixel of a digital image to be memorized, displayed or processed and image creation processing means for creating a digital image by enlarging the pixel size on the basis of a sampled detection signal of the secondary charged particles.

Further, a semiconductor device inspecting system according to the invention is a semiconductor device inspecting system utilizing the aforementioned scanning electron microscope and has a function to measure the dimension of a semiconductor pattern in the digital image by using the digital image created by the image creation processing means.

Further, a semiconductor device inspecting system according to the invention is a semiconductor device inspecting system utilizing the aforementioned scanning electron microscope and has a function to collect or sort defect images on a semiconductor wafer by using the digital image created by the image creation processing means.

According to the scanning electron microscope and semiconductor device inspecting system, a digital image of high image quality can be acquired, preserved, displayed or processed.

These and other objects, features and advantages of the invention will be apparent from the following more particular description of preferred embodiments of the invention, as illustrated in the accompanying drawings.

BRIEF DESCRIPTION OF THE DRAWINGS

FIG. 8 illustrates at (a) the relation between the X direction deflection signal and a sampling clock in the normal mode and at (b) the relation between the X direction deflection signal and a sampling clock in the diagonal mode.

FIG. 11 is a diagram showing an example of a table of the conditions set for image acquisition in a recipe in the one embodiment of the invention.

FIG. 12 is a diagram showing a picture screen for inputting items of image acquisition condition in the one embodiment of the invention.

DESCRIPTION OF THE EMBODIMENTS

Figure 1:
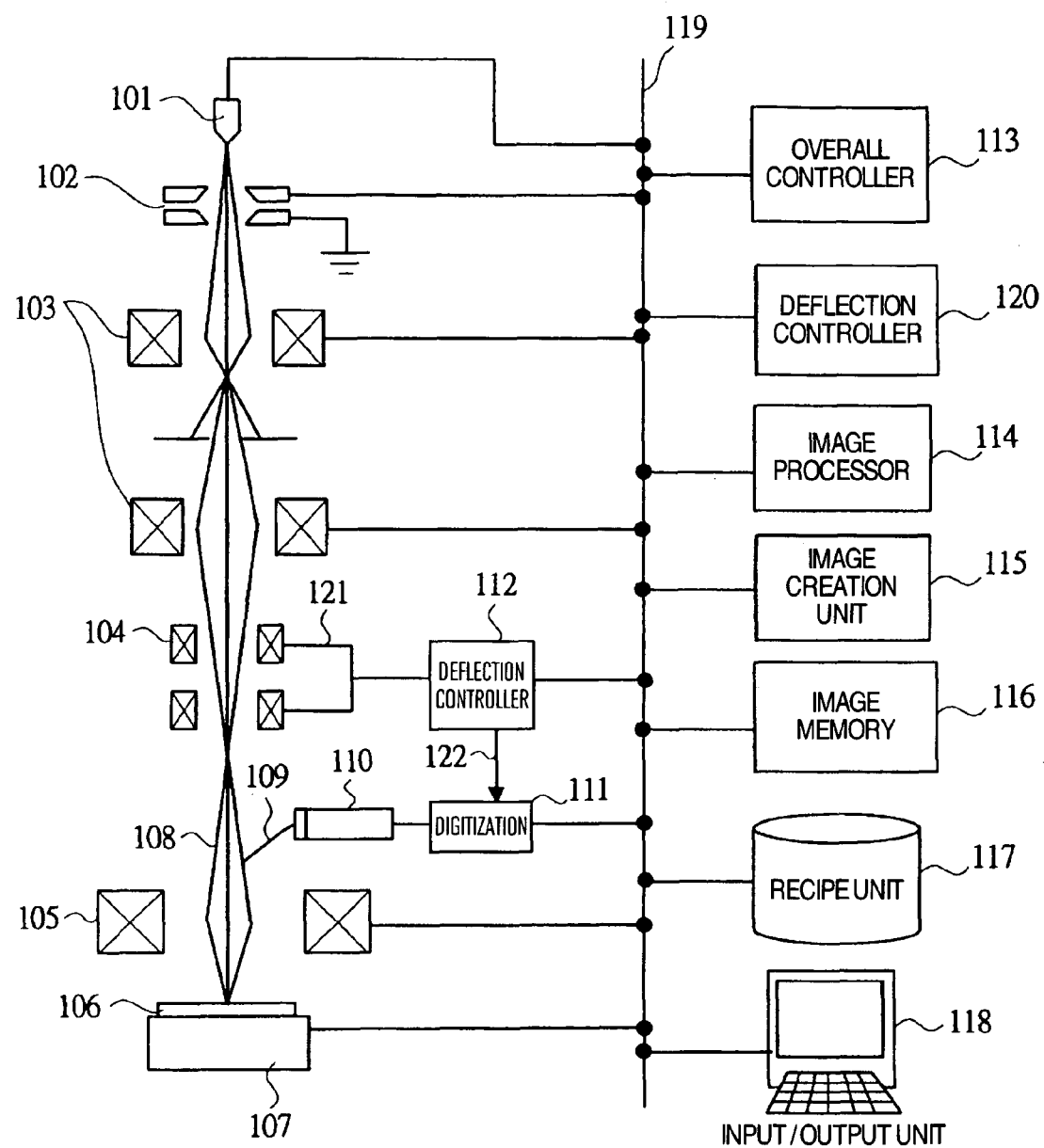
FIG. 1 is a diagram showing the construction of a scanning electron microscope according to one embodiment of the present invention.

Embodiments of the present invention will be described hereunder with reference to the drawings. Throughout Figures for describing the embodiments, like members will be designated by like reference numerals as a rule and will not be explained reiteratively.

FIG. 1 is a diagram showing the construction of a scanning electron microscope according to one embodiment of the present invention.

Referring first to FIG. 1, the scanning electron microscope according to the present embodiment and a scanning electron microscope for Critical Dimension (CD) measurement of semiconductor patterns (semiconductor device inspecting system) using the same will be outlined.

For example, the scanning electron microscope or semiconductor device inspecting system according to the present embodiment comprises an electron source 101 for illuminating a primary electron beam 108 on a specimen wafer 106, an accelerating electrode 102, a condenser lens 103, a deflector 104 and an objective lens 105; a detector 110 for acquiring a digital image by sampling and detecting secondary charged particles 109 generated from the specimen wafer 106 under irradiation of the primary electron beam and a digitizing means 111; an image memory 116 necessary for storing, displaying or processing the acquired digital image, an input/output unit 118, an image creation unit 115 and an image processor 114; and an overall controller 113, a result storage 120 and a recipe unit 117.

The electron source 101 is adapted to generate a primary electron beam 108. The accelerating electrode 102 accelerates the primary electrons. The condenser lens 103 condenses the primary electrons. The deflector 104 scans the primary electrons two-dimensionally. The objective lens 105 focuses the primary electrons on the specimen wafer 106. A stage 107 is adapted to mount the specimen. The detector 110 detects secondary charged particles such as secondary electrons and reflected electrons generated from the specimen. The digitizing means 111 digitizes a detected signal. A deflection controller 112 controls the amount of deflection in the deflector. The individual components are coupled to the overall controller 113 through a bus 119.

Also mutually coupled through the bus 119 in the present system are other components including the image memory 116 for storing image data, the image creation unit 115 for performing an image creation process, the image processor 114 using an acquired image to perform CD measurement of a semiconductor pattern representing the specimen, the recipe unit 117 for memorizing a recipe storing inspection conditions and the like, the input/output unit 118 comprised of such a device as keyboard and mouse for giving commands to the system and of monitor and printer for outputting data from the system and the result storage 120 for storing inspection results.

Figure 2:
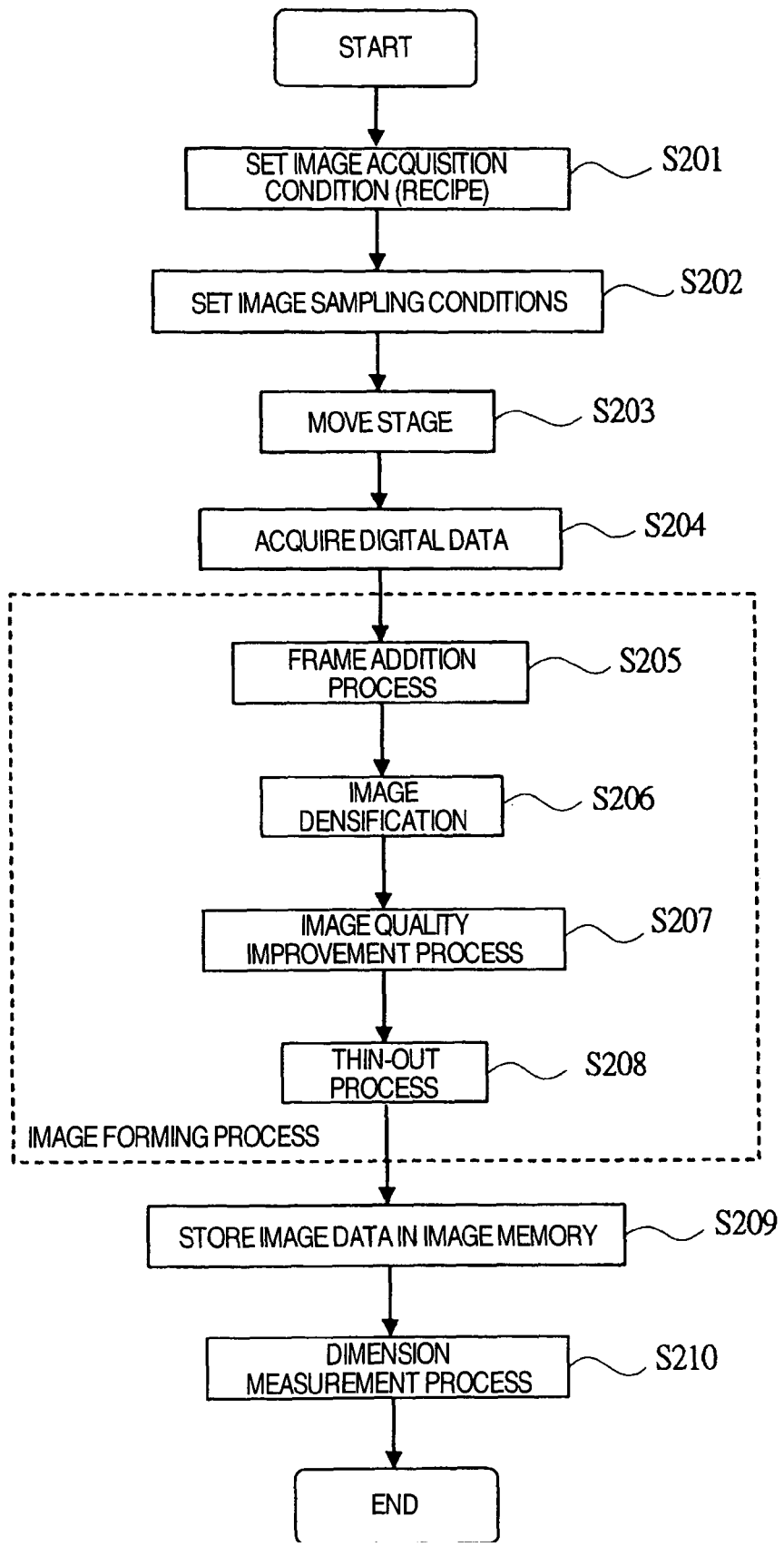
FIG. 2 is a diagram showing a processing flow in the scanning electron microscope according to the one embodiment of the invention.

Next, the sequence of inspecting a semiconductor device pattern in the present system will be described by making reference to FIGS. 1 and 2.

Firstly, it is presupposed that prior to inspection, the specimen wafer 106 is mounted on the stage 107, such conditions as position information of a site at which the size is actually measured on the specimen wafer 106 and various conditions for the electron optics (for example, accelerating voltage, probe current, imaging magnification and so on) are stored in a recipe file and the recipe file is stored in the recipe unit 117.

An operator selects a recipe usable for measurement from a plurality of recipes registered in the recipe unit 117 by way of the input/output unit 118 and commands the overall controller 113 to conduct an inspection under conditions stored in the selected recipe (step S201).

Figure 3:
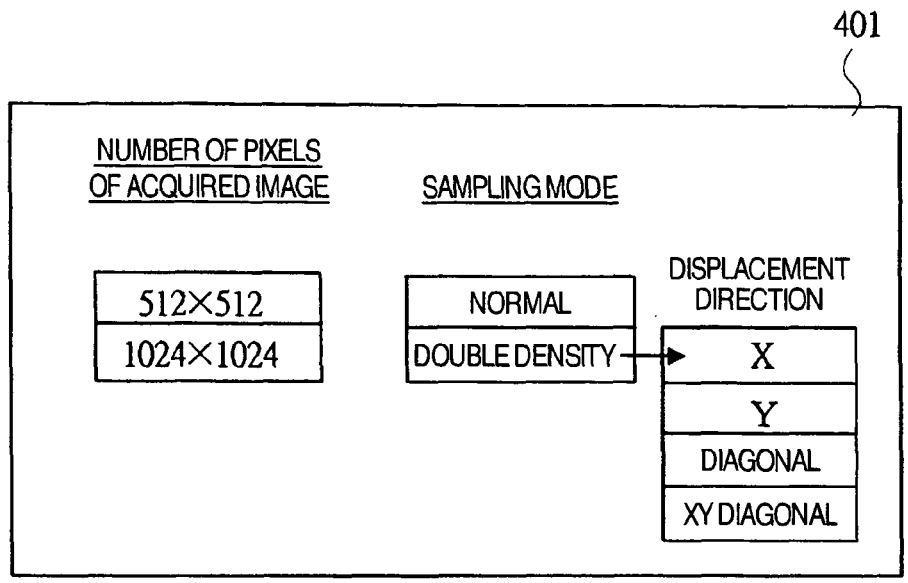
FIG. 3 is a diagram showing an example of the form of a picture screen for designating the sampling mode in the one embodiment of the invention.

Thereafter, the overall controller 113 displays, for example, an image sampling condition setting picture screen 401 as shown in FIG. 3 on the screen of input/output unit 118, urging the operator to make a choice for the number of pixels of an image and the sampling mode (sampling conditions) (step S202).

In the example of FIG. 3, selection is exemplified in which as the number of pixels of an acquisition image, any one out of two of 512×512 pixels and 1024×1024 pixels can be selected. Further, in the sampling mode, any one out of two of "normal" and "double density" can be selected and in the case of double density, the displacement direction can be selected from four kinds of "X", "Y", "diagonal" and XY diagonal".

The double density explained in the present embodiment does not mean that the number of pixels of an image obtained by once scanning two-dimensionally a given region with an electron beam but it indicates an image apparently doubled in pixel pitch which is obtained through synthesis of an image acquired by two-dimensionally scanning a given region with the electron beam and an image acquired by additionally scanning the given region two-dimensionally with the electron beam while making displacement by half the pitch of one pixel from the previous image.

Figure 4:
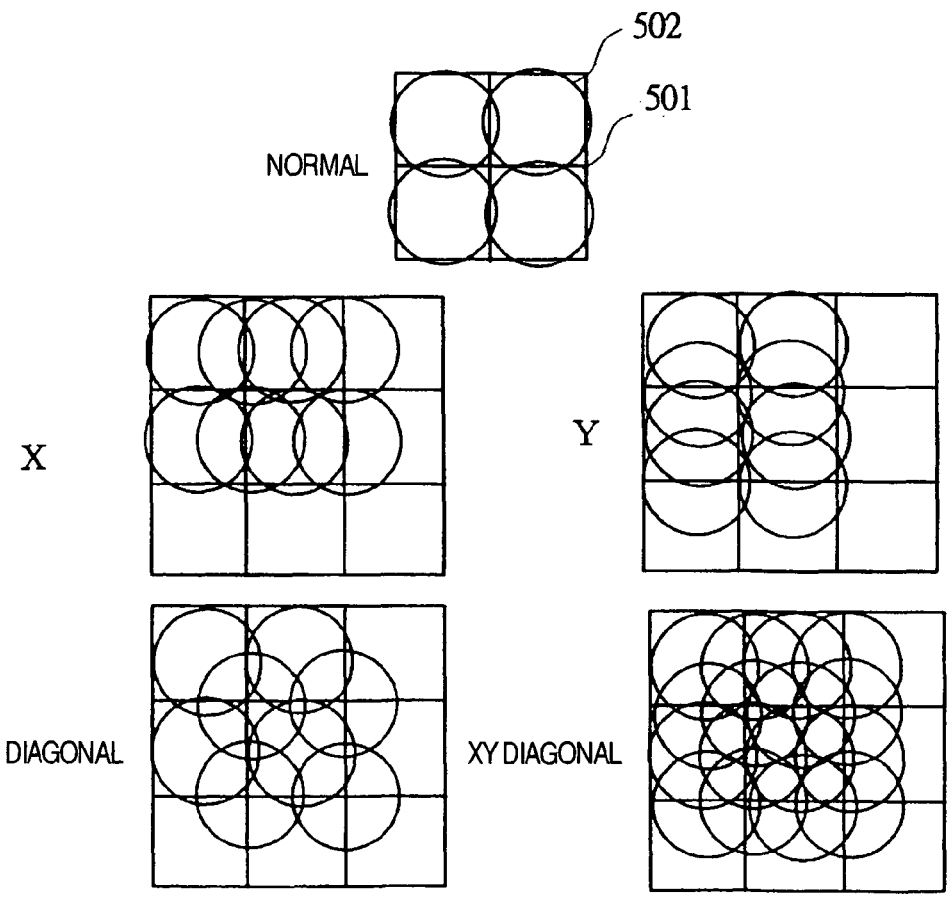
FIG. 4 is a diagram showing various variations of pixel displacement in the one embodiment of the invention.

In respect of the individual sampling modes, a pixel grid of an acquired digital image and positions of data digitally sampled are diagrammatically illustrated in FIG. 4. As will be described later, in the case of acquisition of an image with the SEM, with a view to reducing image noise, the same region of a specimen is scanned plural times two-dimensionally with an electron beam to obtain images of a plurality of frames and the plural frame images are added together to provide an image of reduced noise of a desired region. In obtaining the plural frame images, a plurality of frame images in which the pixel grid 501 is coincident with sampling positions 502 are acquired and added together in the normal mode but in the double density mode, in addition to frame images in which the pixel grid 501 is coincident with the sampling positions 502 similarly to the normal mode, frame images sampled at positions displaced by 0.5 pixels from frame images picked up in the normal node in the "X", Y" and "diagonal" directions are obtained. Furthermore, in the case of "XY diagonal", data is sampled at sites displaced by 0.5 pixels in the "X", "Y" and "diagonal" directions. Illustrated in FIG. 4 is an overlapped image of an image acquired by making the pixel grid 501 coincident with the sampling positions 502 and an image acquired by sampling at positions displaced by 0.5 pixels from the pixel grid 501.

The description of the present embodiment will continue on the assumption that "image size 512×512 pixels" and "diagonal" mode are selected from the image size and the "double density", respectively, in the image sampling condition setting picture screen 401.

Figure 5:
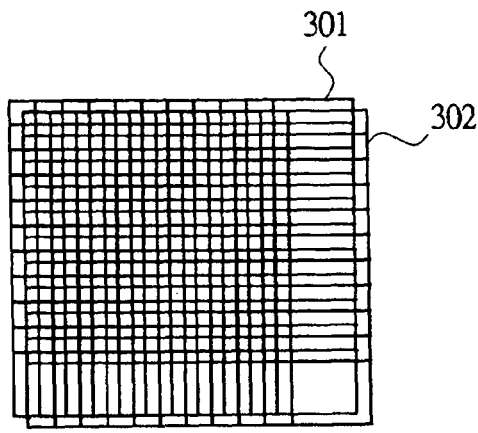
FIG. 5 is a diagram showing two images mutually displaced by 0.5 pixels in oblique direction in the one embodiment of the invention.

In this case, two kinds of images are acquired as shown in FIG. 5 including an image 301 picked up at sampling positions prescribed by the image size to be acquired and an image 302 sampled at positions displaced from the image 301 by 0.5 pixels in the diagonal direction and an image to be preserved, displayed or processed is formed from the two kinds of images.

To add, selection of the image sampling conditions may be set prior to start of inspection in contrast to the present embodiment in which setting is done after start of inspection.

Next, the overall controller 113 moves the stage 107 such that a site to be measured on specimen wafer 106, registered in the recipe unit 117, comes into a field of view for imaging (step S203) and thereafter, digital image data at the site is acquired (step S204). A process for acquisition of image is carried out as will be described below.

Firstly, the primary electron beam 108 emitted from the electron source 101 is accelerated by the accelerating electrode 102, condensed by the condenser lens 103 and then focused by the objective lens 105 so as to be irradiated on a site to be measured on the specimen wafer 106. At that time, the deflection controller 112 controls the deflection range of primary electron beam such that a view field range determined by a magnification value registered in the recipe is scanned two-dimensionally with the primary electrons.

Secondary charged particles 109 generated from the specimen surface under irradiation of the electron beam are captured by the detector 110, converted into an optical signal by means of a scintillator (not shown), followed by further conversion into an electric signal by means of a photo-multiplier (not shown), and thereafter converted into a digital signal by the digitizing means 111. The thus obtained digital signal is stored as a digital image in the image memory 116.

To add, in the scanning electron microscope, shot noise of secondary electrons and the like generated from a specimen abounds and therefore, an image of sufficiently high S/N ratio cannot frequently be obtained by once scanning the same site. Accordingly, scanning of the primary electron beam and acquisition of digital data are normally carried out by the number of times of scanning (the number of frames) designated by the recipe and then, an image is created from pieces of data.

In the present embodiment, the acquiring image number and the sampling mode are so designated as to be 512×512 and "diagonal" of "double density", respectively, in advance in the sampling condition setting picture screen 401 and when the frame number is designated to, for example, 16, 8 images of 512×512 pixels each sampled at the center positions of pixel grid 501 (FIG. 4) and 8 images of 512×512 pixels each picked up at positions displaced from the former images by 0.5 pixels in the oblique direction are acquired and these images are stored in the image memory 116. For convenience of explanation, the former 8 images will be called odd frames and the latter 8 images will be called even frames in the following description.

Next, in the image creation unit 115, an image of 512×512 pixels is created from the odd and even frame images.

Figure 6:
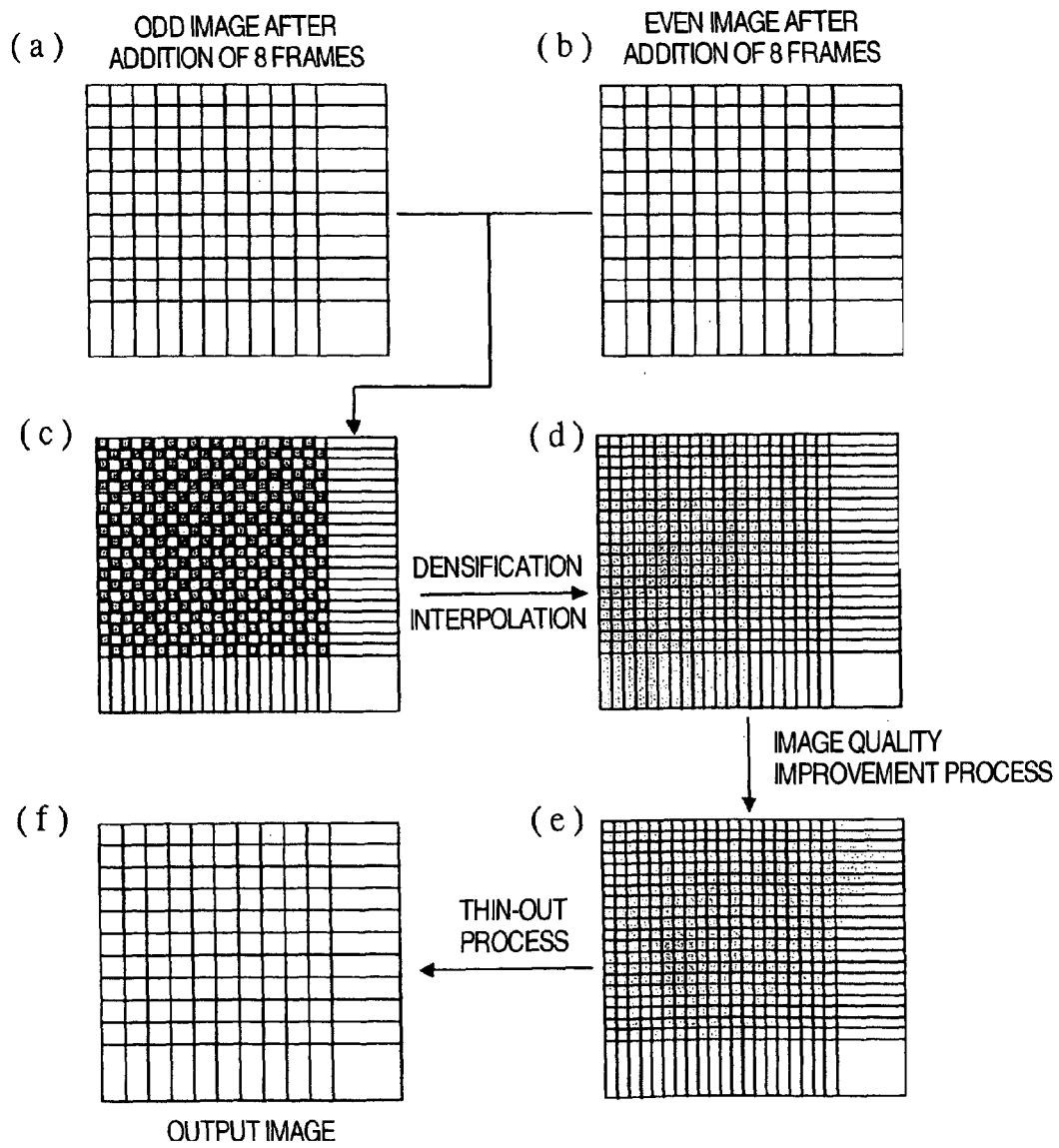
FIG. 6 illustrates at (a) an odd image after addition of 8 frames, at (b) an even image after addition of 8 frames, at (c) an image after addition of the odd and even images, at (d) an image after a densifying interpolation process, at (e) an image after an image quality improvement process and at (f) an image after a thin-out process.

FIG. 6 diagrammatically shows a flow of data in the image creation process. Firstly, a frame addition process is applied to a set of odd frames and a set of even frames (step S205, at (a) and (b) in FIG. 6). Particularly, in each set of the odd and even frames, plural (in this example, 8) images are used in this process to make an image have its individual pixel values which are averages of pixel values at the same pixels of the plural images, thus having the effect of reducing the noise and improving the S/N ratio.

Next, the thus obtained two frame images are used to densify an image (step S206). Firstly, since in this example two images are detected at obliquely displaced positions, an image having pixels arranged at the positions as shown at (c) in FIG. 6 is obtained. This image has 1024×1024 pixels including pixels (white) devoid of data. Then, by filling the blank portions through an interpolation process, an image as shown at (d) in FIG. 6 can be obtained. Here, assumptively, tone values above/below and right/left adjoining the blank portions are averaged and averaged values are substituted for pixel values of the blank portions.

Subsequently, the thus prepared 1024×1024 sized image is applied with an image improvement process such as a de-convolution process for restoring a signal degraded (blurred) by a beam profile of the primary electron beam 108 (step S207). As a result of the image improving process, an image as shown at (e) in FIG. 6 can be obtained. By performing the de-convolution process through the use of energy distribution of the primary electron beam in this manner, a structure finer than the beam diameter size of primary electron beam can be restored as image data. For the de-convolution process, various restoration filters (Wiener filter, constrained least square filter and the like) can be used. As the energy distribution (energy profile) signal of primary electron beam responsible for the cause of degradation, a value calculated through electron beam simulation or an electron beam profile signal measured by any method may be used.

To add, in addition to the aforementioned de-convolution process, various image processing techniques can be applied to the image improvement process. For example, an edge emphasizing process such as an un-sharp masking process for emphasizing the edge on an image or a noise reduction process based on smoothing filtering can be involved.

Then, digital processing such as a thin-out process is finally applied to the image data shown at (e) in FIG. 6 to create an image of 512×512 pixels (step S208). As a consequence, an output image as shown at (f) in FIG. 6 can be obtained. Here, the smoothing process is applied to the 1024×1024 image so as to prevent aliasing due to digital processing from occurring and thereafter, from the thus obtained image, the image of 512×512 pixel size is prepared. The image created in this manner is stored in the image memory 116 (step S209).

When the image creation unit 115 has completed the process as above, the image processor 114 carries out a dimension or size measuring process (CD measuring process) using the created image under the command of the overall controller 113 (step S210). Signified by the CD measuring process is a process in which the size of a wiring pattern or pit pattern picked up on an image is measured on the image and the measured size is converted according to a magnification value during the image acquisition to calculate a dimension of the circuit pattern. Results of calculation are stored in the result storage 120.

If the created image is displayed along with the inspection results on the input/output unit 118, the operator can visually confirm the inspection results. While the present embodiment has been described by making reference to an instance where the CD measuring process is applied to the image of 512×512 pixels having gone through the thin-out process, the CD measuring process can also be applied to an image preceding thin-out operation.

In the foregoing embodiment, the sampling mode is "diagonal" and in this case, two kinds of frame images are sampled while being displaced mutually obliquely. This can be done when the deflection controller 112 generates a deflection signal 121 supplied to the deflector 104 and a sampling clock 122 supplied to the digitizing means 111.

Figure 7A:
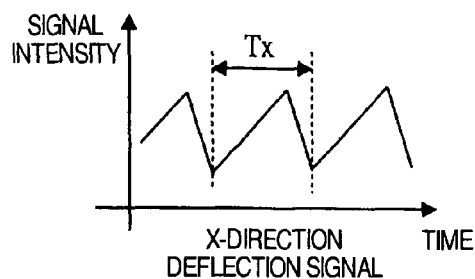
FIG. 7A is a waveform diagram of an X direction deflection signal.
Figure 7B:
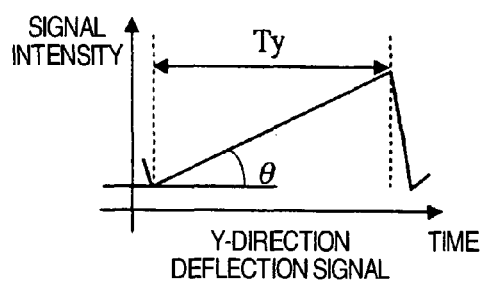
FIG. 7B is a waveform diagram of a Y direction deflection signal.

FIGS. 7A to 7D and FIG. 8 diagrammatically explain these signals. FIGS. 7A and 7B diagrammatically express a deflection signal (sawtooth wave) 121 supplied from the deflection controller 112 to the deflector 104 in order to scan the primary electron beam two-dimensionally. The deflection signal 121 is sorted into two kinds of signals for X and Y and the primary electron beam is deflected to X- or Y-direction in a time of one period (Tx or Yy) of each signal. Then, in accordance with a sampling signal synchronized with the deflection signal 121, the digitizing means 111 conducts sampling of image data. In an example of sampling clock shown at (a) in FIG. 8, 512 pieces of data can exemplarily be sampled during one scan in the X direction.

Figure 7C:
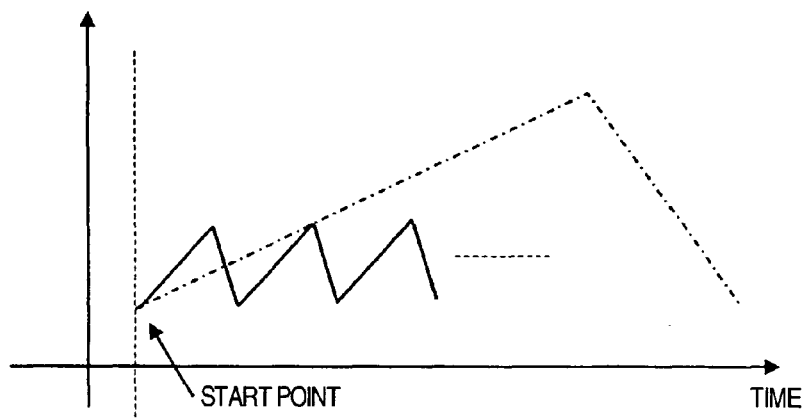
FIG. 7C illustrates waveform diagrams of X direction and Y direction deflection signals, respectively, in the normal mode.
Figure 7D:
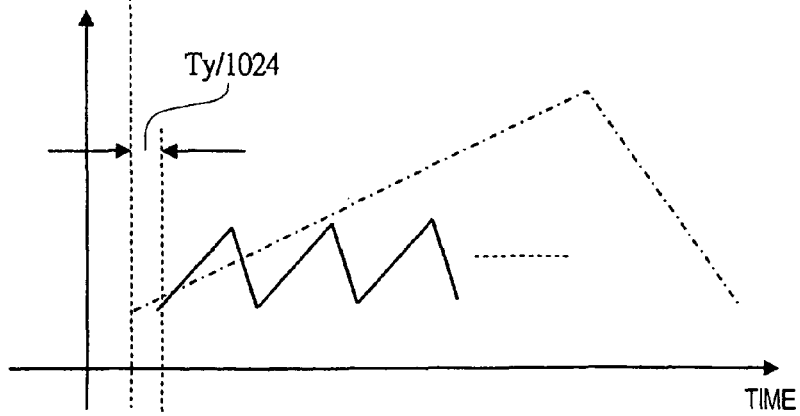
FIG. 7D illustrates waveform diagrams of X direction and Y direction deflection signals, respectively, in the diagonal mode.

Here, if X and Y deflection signals shown in FIGS. 7A and 7B are assumed to be those in the "normal" mode, the two signals have a coincident start time in the "normal" mode as shown in FIG. 7C whereas when an image is obtained obliquely through oblique displacement in the "diagonal" mode, they are in themselves identical to those in FIGS. 7A and 7B but mutually displaced in timing by Ty/1024 as shown in FIG. 7D. This is because scanning in the X direction is started at a position displaced by 0.5 pixels in the Y direction.

On the other hand, for the X direction deflection signal and sampling clock, the relation in the normal mode is expressed at (a) in FIG. 8 but in the case of an obliquely displaced image, expressed as shown at (b) in FIG. 8. This is because a displacement of half period (Tx/1024) is done relative to the clock shown at (a) in FIG. 8 causes data to be sampled at positions displaced by 0.5 pixels in the X direction.

The deflection controller memorizes, as internal parameters, the deflection signal and the period or displacement amount of timing signal to be generated for the respective sampling modes such as X displacement and Y displacement and the amounts of displacement and responsive to a command from the overall controller 113, it reads the internal parameters to generate a deflection signal and a timing clock commensurate with each mode.

The foregoing description has been given by way of the sampling mode selected as the oblique displacement mode of double density but the following process will proceed when another mode is selected.

Figure 9A:
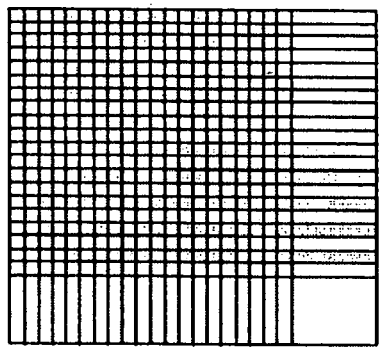
FIG. 9A shows an image densified by selecting an X mode of double density (using images 0.5 pixels displaced in the X direction) and adding odd frames and even frames
Figure 9B:
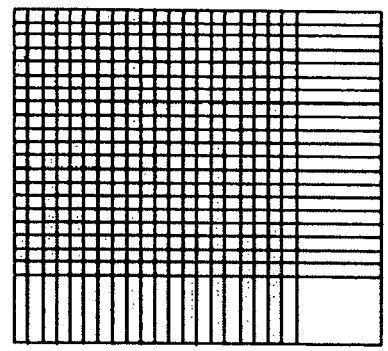
FIG. 9B shows an image densified by selecting a Y mode of double density (using images 0.5 pixels displaced in the Y direction) and adding odd frames and even frames.

Firstly, with the X or Y mode of double density selected, an image densified after completion of frame addition of odd frames or even frames is expressed as shown in FIG. 9A or 9B. In this case, the interpolation process for substituting pixel values for data expressed by white uses an average value of pixel values existing above and below for the X mode or an average value of pixel values existing on right and left sides for the Y mode. The succeeding image quality improvement and the like can be carried out similarly to the preceding example.

Figure 10:
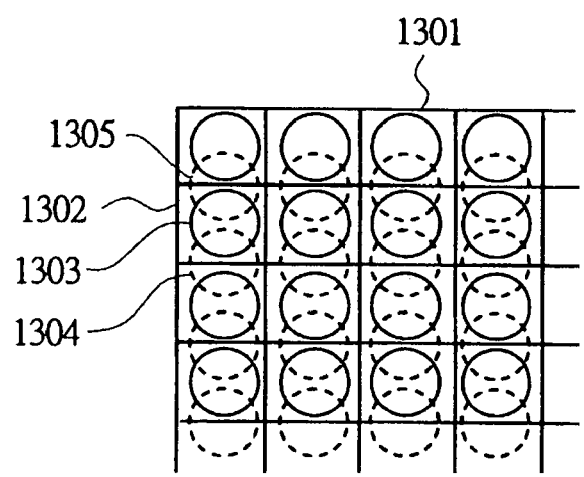
FIG. 10 is a diagram showing an embodiment of an image creation process in the one embodiment of the invention.

Conceivable as another image processing method is a process consolidating the interpolation process, image quality improvement process and thinning-out method. For example, it is assumed in FIG. 10 that data sampled at positions coincident with a grid 1301 of pixels to be acquired are indicated by solid line ○ whereas data sampled at positions displaced from the former by 0.5 pixels in the Y direction are indicated by dotted line ○, each pixel value of an output image of pixels 1302 can be calculated by adding a tone value of data 1303 at solid line ○ with an average of data 1304 and data 1305 at dotted line ○. In this case, S/N improvement and pixel thin-out are performed at a time in respect of the individual pixels through smoothing in the Y direction. In FIG. 10, a process applied to data acquired in the "Y" mode is shown but processes applied to data acquired in the "X" mode and "diagonal" mode can be conducted in a similar way.

In case the "XY diagonal" mode of double density is selected, data four times greater than that obtained in the normal mode can be acquired. In this case, acquired plural frame images are not sorted into two kinds of odd and even frames but are sorted into four kinds. When a frame addition process is applied to each of the four kinds of frames and resulting pixel values are arranged as shown at (c) in FIG. 6, execution of the interpolation process can be dispensed with because data exist in all pixels in this example. The succeeding image quality improvement process can be performed similarly to the aforementioned example. But, in comparison with the "X", "Y" and "diagonal" modes, twice as much time is needed for image acquisition in this "XY diagonal" mode when the dosage of electron beam irradiated on one pixel remains unchanged.

Further, in connection with the previously-described embodiment directed to acquisition of the image of 512×512 pixels through oblique displacement, an instance is shown in which on the assumption that one image of 512×512 pixels can be obtained by one two-dimensional scanning operation of an irradiated primary electron beam, an image is obtained for which the sampling position is not displaced during a scanning operation of the odd frequency and an image is obtained for which the sampling position is displaced by 0.5 pixels in the oblique direction during a scanning operation of the even frequency. But the odd/even frequency is a concept for explanation only and the practicing method is not limited thereto. For example, during scanning operations effected 16 times, images without positional displacement can be obtained in the first to eighth scanning operations and images displaced obliquely by 0.5 pixels can be obtained in the ninth to sixteenth scanning operations.

Furthermore, by controlling the position at which the beam is scanned and the sampling timing, a frame devoid of position displacement and a frame subject to displacement can be obtained at a time through one two-dimensional scanning operation of the primary electron beam. For example, if the rate of sampling is doubled to halve the sampling pitch when the beam is scanned in the X direction, images in the X direction, corresponding to "X" in FIG. 4, can be obtained through one scanning operation and if the beam shift pitch in the Y direction is halved, images in the Y direction, corresponding to "Y" in FIG. 4, can be obtained through one scanning operation. In this case, signals detected by the detector 110 at an odd-frequency sampling signal and an even-frequency sampling are stored in separate image memories (two of image memory 116 shown in FIG. 1 are provided), respectively, and are respectively reproduced by an image reproduction unit (corresponding to image creation unit 115 in FIG. 1), thus ensuring that two kinds of images for which the sampling position differs can be obtained. By applying the same processes as those explained previously to the two kinds of images subject to different sampling positions, a high-quality image of less noise can be obtained.

Moreover, by combining the aforementioned X direction scanning with Y direction scanning, "diagonal" and "XY diagonal" in FIG. 4 can be conducted.

In the instance set forth so far, sampling is effected at positions displaced by 0.5 pixels in relation to the sampling intervals for an image to be acquired but the image forming process according to the present invention is not limited thereto. For example, in obtaining an image of 512×512 pixels, data may be acquired by providing four kinds of displacement amounts of 0.0/0.25/0.5/0.75 pixels in the X direction and two kinds of displacement amounts of 0.0/0.5 pixels in the Y direction and using all sets of displacement amounts in the X and Y directions in combination, so that image data of 2048×1024 pixels can be obtained. In this instance, by making an average value of 8 pixels (included in 4 pixels in the X direction and 2 pixels in the Y direction) of the 2048×1024 sized image a value of one pixel of the 512×512 sized image, smoothing and thin-out can be materialized at a time and ultimately, an image of 512×512 pixels can be formed.

Next, another embodiment of the scanning electron microscope according to this invention will be described. When a very minute object is observed as in the case of use of the scanning electron microscope for the sake of inspection of a semiconductor pattern, a fine structure of the object needs to be analyzed and therefore, the imaging magnification must be set to a high value of about 100,000 magnifications. Under such a condition, the field of view becomes narrow and depending on the accuracy of movement of the specimen stage 107, a site to be picked up will sometimes go out of the field of view. To cope with this problem, the sequence of two steps has hitherto been used including (1) obtaining an image of a wide field of view at low magnification to search from the image a portion where an observing site is picked up and (2) photographing the searched portion at high magnification.

In this case, the image picked up at low magnification in the first step is not responsible for watching a fine structure of the specimen and need not particularly be of high image quality, so that it is rather required that as far as a level of image quality for making the observing site searchable is assured, image acquisition be completed within a shorter time for the purpose of improving the throughput of the overall process. In such a case, sampling of many pieces of pixel data by the method described in the foregoing embodiment is not preferable. Accordingly, there needs a scanning electron microscope having the function to switch the image sampling methods in accordance with the image acquisition conditions.

The scanning electron microscope as such can be materialized by holding a table of correspondence between the image acquisition condition (magnification, probe current, accelerating voltage) and the sampling mode in a recipe unit 117 in the present embodiment and urging an operator to select the contents of the table when setting conditions for image acquisition.

Assumptively, a data table as shown in FIG. 11, for example, is stored in the recipe unit 117. In setting an image acquisition condition, the contents of the table is displayed on the input/output unit 118 and the operator selects condition items for operations of image acquisition at low and high magnifications, respectively, and designates numbers (1, 2 and so on) of the selected condition items. For example, if, in the aforementioned sequence, No. 1 is selected as an acquisition condition for low magnification image and No. 4 is selected as an image acquisition condition for high magnification, the designation of the acquisition condition for low magnification image is such that the accelerating voltage is 800V, probe current is 20 pA, magnification is 50,000 magnifications, frame number is 8, number of pixels of an image is 256×256 and sampling mode is normal mode and the designation of the acquisition condition for high magnification image is such that the accelerating voltage is 500V, probe current 8 pA, magnification is 100,000 magnifications, frame number is 16, number of pixels of an image is 512×512 and sampling mode is double density/XY diagonal mode.

Setting of the image acquisition condition as above is not limited to the method for selection from the table described herein but for example, a display picture screen as shown in FIG. 12 may be displayed on the input/output unit 118 so that the user may be allowed for setting. In the display picture screen shown in FIG. 12, for individual images of low magnification and high magnification, the operator can input accelerating voltage, probe current and frame number and the user is also enabled to select one of a plurality of items in respect of image acquisition magnification, image pixel number and sampling mode.

Figure 13:
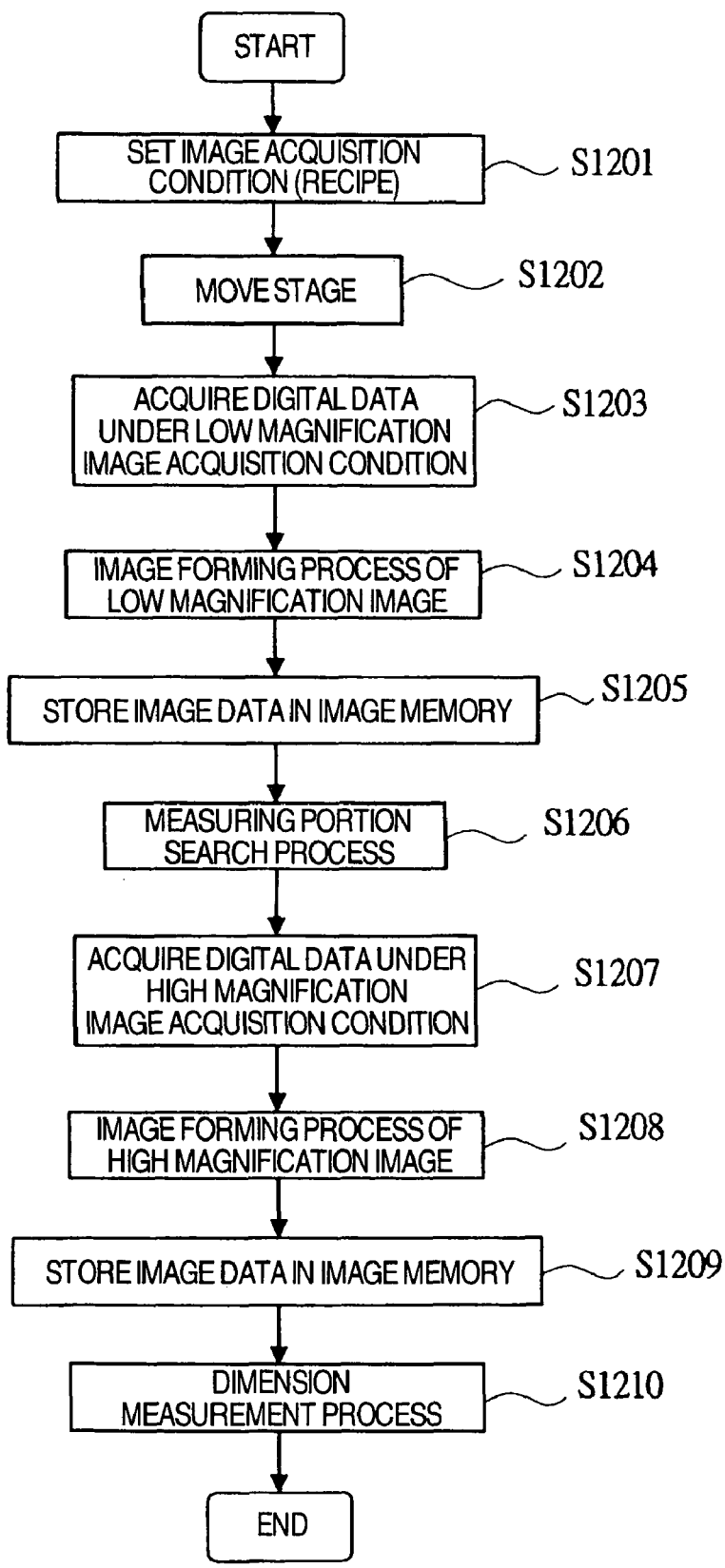
FIG. 13 is a diagram showing a processing flow in the scanning electron microscope in the one embodiment of the invention.
Figure 14A:
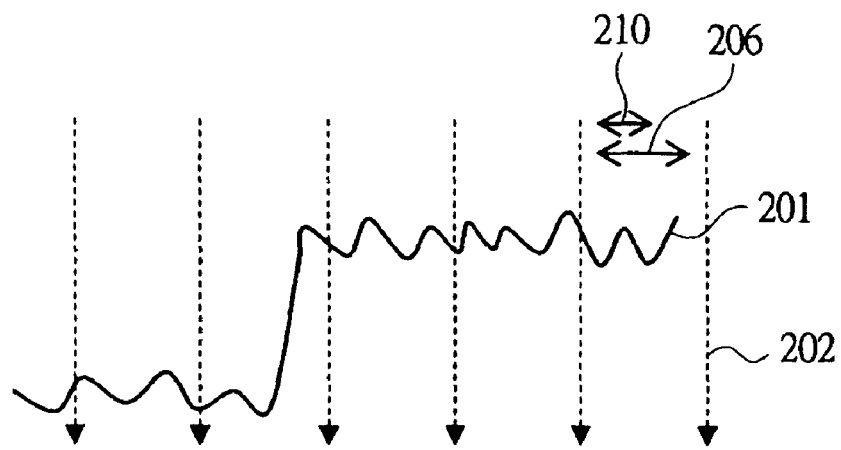
FIG. 14A is a diagram showing the status in which secondary charged particles generated from a specimen are sampled at constant sampling intervals 206 and FIG. 14B is a diagram diagrammatically showing, in frequency space, the status in which secondary charged particles generated from a specimen are sampled at constant sampling intervals 206.
Figure 14B:
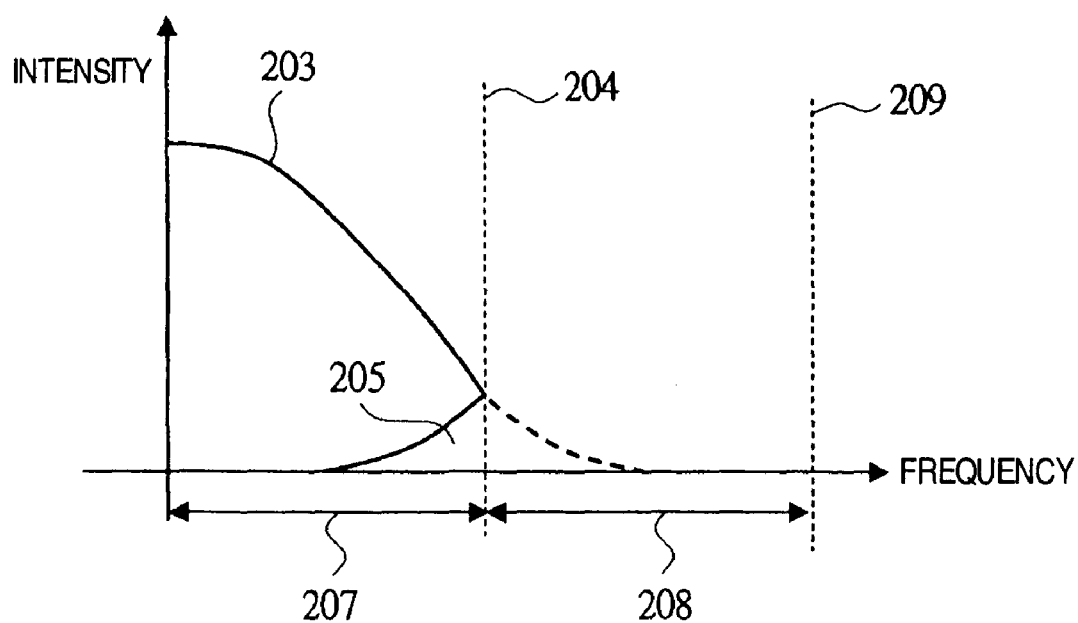

In case the image acquisition condition is set through the input/output unit 118 as described herein, a concrete process flow as shown in FIG. 13 proceeds.

Assumptively, the correspondence relation between the image acquisition condition and the sampling method is first defined as shown in FIG. 12 in advance of start of the process. Then, upon start of a CD measuring process, the operator consults the contents of FIG. 12 table displayed on the input/output unit 18 and selects, for example, No. 1 for low magnification image acquisition condition and No. 4 for high magnification condition (step S1201). With the image acquisition conditions selected, the overall controller 113 recognizes that an image of 256×256 pixels in the normal mode is picked up at 800V accelerating voltage and 20 pA probe current during low magnification photographing and an image of 512×512 pixels in the "XY diagonal" mode of "double density" is picked up at 500V accelerating voltage and 8 pA probe current during high magnification photographing and stores data to this effect in the deflection controller 112.

Thereafter, as the operator commands measurement start, the stage is moved such that a measuring portion comes into the field of view (step S1202), followed by acquisition of digital image data under the image acquisition condition for low magnification photographing and sampling condition (step S1203). In this phase, to permit image acquisition to be performed in the given mode, the deflection controller 112 generates a deflection signal 121 and a sampling clock 122. Then, an image forming process explained in connection with the steps S205 to S208 in FIG. 2 is applied to the acquired digital image data at low magnification (step S1204). The image data having gone through the image forming process is stored in the image memory 116 (step S1205), a site to be measured is searched by means of the image processor 114 through the use of the created image (step S1206) and then an image is picked up at high magnification such that the site is placed in the center of the field of view (step S1207). In this case, too, in order to acquire an image in the previously set mode (in this example, double density/XY diagonal mode with 512×512 pixels), the deflection controller 112 generates a deflection signal 121 and a sampling clock 122. Then, an image forming process explained in connection with the steps S205 to S208 in FIG. 2 is applied to the thus obtained digital image data at high magnification (step S1208). The image data applied with the image forming process is stored in the image memory 116 (step S1209) and in the image processor 114, a dimension measuring process is carried out using the created image (step S1210).

And also, in this example, both the accelerating voltage and the probe current are changed for the low magnification and high magnification acquisition images. This is accounted for by the fact that with the accelerating voltage and probe current changed in the scanning electron microscope, the quality of an obtained image, electricity charging on the specimen and the amount of damage of specimen the electron beam imposes change and in some applications, setting of proper conditions compliance with the image acquisition magnification is preferable. For example, during high accelerating voltage operation or high probe current operation liable to cause electricity charging on the specimen, photographing is preferably conducted under the condition for less dosage of irradiating electrons (normal mode) and according to the present invention, such a case can be dealt with.

In addition, the present invention can be applied to not only the CD measuring device for semiconductors using the scanning electron microscope but also, for example, a review SEM for automatically collecting defective images on a semiconductor wafer and observing/sorting the images. In the previously-described CD measuring SEM, the process for searching a measuring portion is executed in the step S1206, an image of a measuring site is acquired under the high magnification image acquisition condition in the step S1207 and the dimension measuring process is carried out in the step S1210 by using the image of the measuring site acquired under the high magnification image acquisition condition and applied with the image forming process but in the case of the review SEM, a process for extracting a defect to be observed on a wafer is conducted in a step corresponding to the step S1206, an image of the extracted defect is acquired under the high magnification image acquisition condition in a step corresponding to the step S1207 and then, in a step corresponding to the step S1210, a process is carried out in which quantities characteristic of the defect (dimension, area, height, shape and position of the defect) are calculated by using the image of the defect acquired under the high magnification image acquisition condition and then applied with the image forming process and the characteristic quantities are used to sort the defect in accordance its kind as to whether the defect is deposited foreign matters or wiring making contact with an adjoining wiring conductor. In the review SEM, too, a step of picking up a wide field of view necessary for finding a minute defect and a step of acquiring a narrow field of view necessary for observing a fine structure of the defect are needed and in the steps, the size of image and the sampling method can be changed in accordance with what is aimed at by the image to be photographed as described in the example of the CD measuring SEM.

Thus, according to the scanning electron microscope and semiconductor device inspecting system of the present embodiment, a digital image of higher image quality than that in the conventional device can be acquired, preserved, displayed or processed.

In the foregoing, the invention made by the present inventors has been described specifically with reference to the embodiments thereof but the invention is in no way limited to the foregoing embodiments and can be changed in various ways without departing from its gist.

The present invention can also be applied to a scanning electron microscope used for inspection of semiconductor devices and a semiconductor device inspecting system using the same.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

The invention claimed is:

1. A scanning electron microscope comprising:
   electron beam illumination means for irradiating an electron beam on a desired region of a specimen while scanning the electron beam thereon;
   digital image acquisition means for detecting secondary charged particles generated from a surface of the desired region of said specimen under scanning irradiation of the electron beam by said electron beam illumination means and digitizing a detected signal at a predetermined sampling clock so as to acquire a digital image of the desired region of said specimen;
   image processing means for processing the digital image acquired by said digital image acquisition means; and control means for controlling said electron beam illumination means, said digital image acquisition means and said image processing means;

wherein said digital image acquisition means obtains images of a plurality of frames by scanning the electron beam plural times on the desired region of said specimen, such that frame images acquired in sampling positions are added to frame images acquired at positions displaced or shifted by under 1 pixels from the frame images acquired in the sampling positions in a X-direction, Y-direction or diagonal direction; and wherein said image processing means processes said images of said plurality of frames.

2. A scanning electron microscope according to claim 1, wherein said digital image acquisition means obtains the frame images for which the timing of said sampling clock is shifted by a smaller interval than that of said sampling clock and applies to the frame images for which timing of said sampling clock is shifted.

3. A scanning electron microscope according to claim 1, wherein said image processing means performs a frame addition process in which odd and even frame images are added to create an image in which individual pixel values are averages of pixel values at the same pixels of the plural frame images, a densification process in which said plural frame images are used to densify an image having a large number of pixels, an image improvement process in which a degraded image is restored, and a thin-out process in which pixels of an image are thinned out to prevent aliasing.

4. A scanning electron microscope according to claim 1, wherein said scanning electron microscope is any one of a SEM including a unit which measures dimensions or size of the pattern formed on the specimen, a SEM including a unit which detects defects of the pattern formed on the specimen and a SEM including a unit which reviews defects of the pattern formed on the specimen.

5. A scanning electron microscope according to claim 1, wherein said digital image acquisition means obtains images of a plurality of frames by scanning the electron beam plural times on the desired region of said specimen, such that frame images acquired in sampling positions are added to frame images acquired at positions displaced or shifted by 0.5 pixels from the frame images acquired in the sampling positions in a X-direction, Y-direction or diagonal direction.

6. A scanning electron microscope according to claim 1, wherein said control means controls said electron beam illumination means to scan the electron beam plural times on the desired region of said specimen, and controls said image acquisition means to obtain images of a plurality of frames such that frame images acquired in sampling positions are added to frame images acquired at positions displaced or shifted by 0.5 pixels from the frame images acquired in the sampling positions in a X-direction, Y-direction or diagonal direction.

7. A scanning electron microscope comprising:

electron beam illumination means for irradiating a focused electron beam on a desired region of a specimen while scanning the electron beam thereon;

digital image acquisition means for detecting secondary charged particles generated from a surface of the desired region of said specimen under scanning irradiation of the electron beam by said electron beam illumination means and digitizing a detected signal so as to acquire a digital image of the desired region of said specimen;

image processing means for processing the digital image acquired by said digital image acquisition means; and control means for controlling said electron beam illumination means, said digital image acquisition means and said image processing means;

wherein said digital image acquisition means obtains images of a plurality of frames of the desired region of said specimen by scanning the electron beam plural times on the desired region of said specimen, such that frame images acquired in sampling positions are added to frame images acquired at positions displaced or shifted by under 1 pixels from the frame images acquired in the sampling positions in a X-direction, Y-direction or diagonal direction; and wherein said image processing means processes said images of said plurality of frames.

8. A scanning electron microscope according to claim 7, wherein said image processing means performs a frame addition process in which odd and even frame images are added to create an image in which individual pixel values are averages of pixel values at the same pixels of the plural frame images, a densification process in which plural frame images are used to densify an image having a large number of pixels, an image improvement process in which a degraded image is restored, and a thin-out process in which pixels of an image are thinned out to prevent aliasing.

9. A scanning electron microscope according to claim 7, wherein said scanning electron microscope is any one of a SEM including a unit which measures dimensions or size of the pattern formed on the specimen, a SEM including a unit which detects defects of the pattern formed on the specimen and a SEM including a unit which reviews defects of the pattern formed on the specimen.

10. A scanning electron microscope according to claim 7, wherein said digital image acquisition means obtains images of a plurality of frames of the desired region of said specimen by scanning the electron beam plural times on the desired region of said specimen, such that frame images acquired in sampling positions are added to frame images acquired at positions displaced or shifted by 0.5 pixels from the frame images acquired in the sampling positions in a X-direction, Y-direction or diagonal direction.

11. A scanning electron microscope comprising:

an electron beam illumination unit arranged to illuminate an electron beam on a desired region of a specimen while scanning the electron beam thereon;

an image acquisition unit arranged to detect secondary charged particles generated from a surface of the desired region of said specimen and to acquire a digital image of the desired region of said specimen;

an image processor arranged to perform a dimension or size measurement of a pattern representing said specimen using an acquired image; and a controller to control the operation of the electron beam illumination unit, the image acquisition unit and the image processor, wherein the controller controls the electron beam illumination unit to scan the electron beam plural times on the desired region of said specimen, the image acquisition unit to obtain images of a plurality of frames such that frame images acquired in sampling positions are added to frame images acquired at positions displaced or shifted by under 1 pixels from the frame images acquired in the sampling positions in a X-direction, Y-direction or diagonal direction, and the image processor processes said images of said plurality of frames.

12. A scanning electron microscope according to claim 11, wherein the image processor is configured to perform:

a frame addition process in which odd and even frame images are added to create an image in which individual pixel values are averages of pixel values at the same pixels of the plural frame images;

a densification process in which said plural frame images are used to densify an image having a large number of pixels;

an image improvement process in which a degraded image is restored; and a thin-out process in which pixels of an image are thinned out to prevent aliasing.

13. A scanning electron microscope according to claim 11, wherein said scanning electron microscope is any one of a SEM including a unit which measures dimensions or size of the pattern formed on the specimen, a SEM including a unit which detects defects of the pattern formed on the specimen and a SEM including a unit which reviews defects of the pattern formed on the specimen.

14. A scanning electron microscope according to claim 11, wherein the digital image acquisition unit obtains images of a plurality of frames of the desired region of said specimen by scanning the electron beam plural times on the desired region of said specimen, such that frame images acquired in sampling positions are added to frame images acquired at positions displaced or shifted by 0.5 pixels from the frame images acquired in the sampling positions in a X-direction, Y-direction or diagonal direction.

15. A scanning electron microscope according to claim 11, wherein the controller controls the electron beam illumination unit to scan the electron beam plural times on the desired region of said specimen, and controls the image acquisition unit to obtain images of a plurality of frames such that frame images acquired in sampling positions are added to frame images acquired at positions displaced or shifted by 0.5 pixels from the frame images acquired in the sampling positions in a X-direction, Y-direction or diagonal direction.

* * * * *